(12) United States Patent
Cahalane et al.

(10) Patent No.: US 12,470,217 B2
(45) Date of Patent: Nov. 11, 2025

(54) CONFIGURABLE INTERFACE CIRCUIT

(71) Applicant: Analog Devices International Unlimited Company, Limerick (IE)

(72) Inventors: Aidan Cahalane, Limerick (IE); Alan Patrick Cahill, Limerick (IE); Ahmed Mamdouh Badawy, Limerick (IE)

(73) Assignee: Analog Devices International Unlimited Company, Limerick (IE)

( * ) Notice: Subject to any disclaimer, the term of this patent is extended or adjusted under 35 U.S.C. 154(b) by 52 days.

(21) Appl. No.: 18/421,090

(22) Filed: Jan. 24, 2024

(65) Prior Publication Data

US 2025/0240019 A1 Jul. 24, 2025

(51) Int. Cl.
*H03K 19/01* (2006.01)
*G01R 19/00* (2006.01)
*H03K 17/081* (2006.01)
*H03K 19/0175* (2006.01)

(52) U.S. Cl.
CPC . *H03K 19/017581* (2013.01); *G01R 19/0084* (2013.01); *H03K 17/08104* (2013.01)

(58) Field of Classification Search
CPC ..... H03K 19/017581; H03K 17/08104; G01R 19/0084
See application file for complete search history.

(56) References Cited

U.S. PATENT DOCUMENTS

| | | | |
|---|---|---|---|
| 5,467,024 A * | 11/1995 | Swapp | G01R 31/2851 324/73.1 |
| 10,181,853 B2 | 1/2019 | Slattery et al. | |
| 2020/0295771 A1* | 9/2020 | O'Sullivan | H03M 1/66 |

* cited by examiner

*Primary Examiner* — Daniel C Puentes
(74) *Attorney, Agent, or Firm* — DLA Piper LLP (US)

(57) ABSTRACT

The present disclosure relates to a configurable interface circuit supporting a plurality of different selectable operational modes. In one example the interface circuit comprises a device terminal couplable to an external field device, a digital current path coupled to the device terminal, and having a first sense resistor, and an analog current path having a second sense resistor. When the configurable interface circuit is operating in the analog mode, an analog current can flow through the analog current path and an analog signal can be measured by measuring a voltage across the first sense resistor and second sense resistor, and when the configurable interface circuit is operating in the digital mode, a digital current is controlled to flow through the digital current path and a digital signal can be measured by measuring the voltage across the first sense resistor and second sense resistor.

19 Claims, 9 Drawing Sheets

CONFIGURABLE INTERFACE CIRCUIT

TECHNICAL FIELD

The present disclosure relates to a configurable interface circuit configured capable of measuring analog and digital currents when operating in analog and digital modes.

BACKGROUND

Electronic modules can be used to facilitate monitoring or control for applications such as chemical or industrial process control, motion control, building control such as for control of Heating, Ventilation, and Air Conditioning (HVAC). Such modules can have hardware interfaces that provide current or voltage output, and separate inputs such as for monitoring current, voltage, or resistance (such as for measurement using Resistance Temperature Devices (RTDs)). Electronic modules can provide signal conditioning, such as including one or more of filtering or protection devices, and can provide analog-to-digital conversion capability.

SUMMARY

In a first aspect of the disclosure there is provided a configurable interface circuit supporting selectable operational modes, including an analog mode and a digital mode, the interface circuit comprising: a device terminal couplable to an external field device; a digital current path coupled to the device terminal, wherein the digital current path comprises a digital sense resistor having a first terminal coupled to the device terminal; an analog current path comprising an analog sense resistor having a first terminal coupled to the first terminal of the digital sense resistor; and a measurement circuit comprising: a first input terminal coupled to a second terminal of the digital sense resistor; and a second input terminal coupled to a second terminal of the analog sense resistor, wherein, when the configurable interface circuit is operating in the analog mode, an analog current can flow through the analog current path and the device terminal and the measurement circuit is configured to measure an analog signal by measuring a voltage between the first input terminal and the second input terminal, and wherein, when the configurable interface circuit is operating in the digital mode, a digital current is controlled to flow through the digital current path and device terminal, and the measurement circuit is configured to measure a digital signal by measuring the voltage between the first input terminal and the second input terminal.

In a second aspect of the disclosure there is provided a method for operating a configurable interface circuit in any of a plurality of selectable operational modes, including an analog mode and a digital mode, wherein the configurable interface circuit comprises: a device terminal couplable to an external field device; a digital current path coupled to the device terminal, wherein the digital current path comprises a digital sense resistor having a first terminal coupled to the device terminal; an analog current path comprising an analog sense resistor having a first terminal coupled to the first terminal of the digital sense resistor; and a measurement circuit comprising: a first input terminal coupled to a second terminal of the digital sense resistor; and a second input terminal coupled to a second terminal of the analog sense resistor, wherein the method comprises: when the configurable interface circuit is operating in the analog mode and an analog current can flow through the analog current path: measuring, by the measurement circuit, an analog signal by measuring a voltage between the first input terminal and the second input terminal, and when the configurable interface circuit is operating in the digital mode and a digital current can flow through the digital current path: measuring, by the measurement circuit, a digital signal by measuring the voltage between the first input terminal and the second input terminal.

In a third aspect of the disclosure there is provided an interface circuit supporting a plurality of selectable operational modes, the interface circuit comprising: a device terminal couplable to an external field device; a first current path coupled to the device terminal, wherein the first current path comprises a first sense resistor having a first terminal coupled to the device terminal; and a second current path comprising a second sense resistor having a first terminal coupled to the first terminal of the first sense resistor; wherein, when the interface circuit is operating in a first mode where a first current can flow through the first current path, the interface circuit is configured to measure a first signal by measuring a voltage between a second terminal of the first sense resistor and a second terminal of the second sense resistor, and wherein, when the interface circuit is operating in a second mode where a second current can flow through the second current path, the interface circuit is configured to measure a second signal by measuring the voltage between the second terminal of the first sense resistor and the second terminal of the second sense resistor.

DRAWINGS

Aspects of the present disclosure are described, by way of example only, with reference to the following schematic drawings, in which.

DETAILED DESCRIPTION

As explained in more detail below, configurable interface circuits typically include a number of different modes, which include one or more analog modes and one or more digital modes. The interface circuits typically include functionality to measure analog currents and/or voltages during analog mode operation, but not digital currents and/or voltages. For many application spaces this is sufficient, but it has been recognised that a measurement of currents and/or voltages during digital mode operation may be useful for purposes such as diagnostics.

The present disclosure relates to a configurable interface circuit that is equipped with both analog and digital signal measurement capability. Digital signal capability has been added to existing circuits at a minimum of cost by virtue of the inclusion of an additional sensing resistor in the digital current path. A measurement circuit, which may include an ADC, is configured to measure a voltage that is across the sensing resistor in the digital current path and the pre-existing sensing resistor in the analog current path. During digital mode operation, no (or negligible) current flows through the analog current path, so the measurement corresponds to the voltage across the sensing resistor in the digital current path. During analog mode operation, no (or negligible) current flows through the digital current path, so the measurement corresponds to the voltage across the sensing resistor in the analog current path. Consequently, both digital and analog currents/voltages can be measured by the same measurement circuit, without requiring any changes to the measurement circuit, by virtue of the inclusion of a sensing resistor in the digital current path, which is a very low cost and low complexity component. As a result, the additional functionality of digital signal measurement has been added efficiently and cost effectively.

Figure 1:
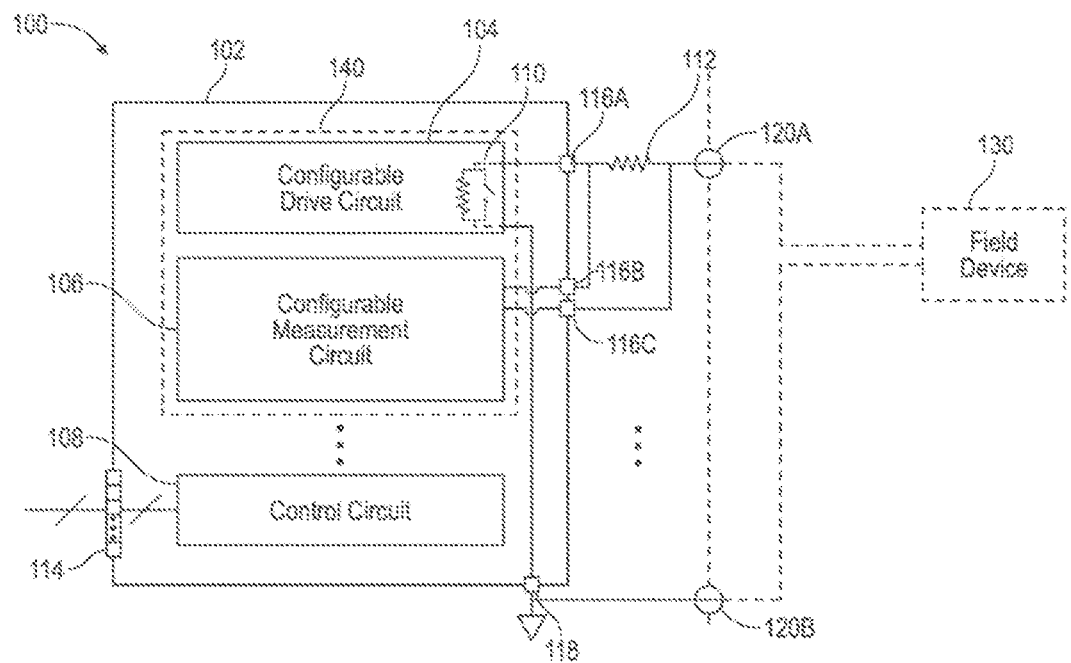
FIG. 1 shows an example of a configurable interface circuit.

FIG. 1 illustrates generally an example comprising a configurable interface circuit 100 that can include a configurable drive circuit 104 and a configurable measurement circuit 106, where the interface circuit 100 can be coupled to one or more field devices, such as a field device 130. The use of the phrase "field device" can generally refer to one or more of an actuator, sensor, or other device. The field device 130 need not be located a particular distance from the interface circuit 100, but would generally be located remotely with respect to the interface circuit 100. The field devices can be coupled to the interface circuit 100 such as using one or more screw terminals or other electrical interconnections, such as including a first device terminal 120A, and a second device terminal 120B. In an example, the second device terminal 120B can be commonly-shared amongst multiple field devices as a ground or common terminal (which may be at ground or any other suitable common reference voltage). The interface circuit 100 can include an integrated circuit package 102, such as having one or more monolithically-integrated circuits housed with the package 102. A combination of the configurable drive circuit 104 and the configurable measurement circuit 106 can define a configurable channel, and the interface circuit 100 can include multiple channels, such as implemented within the integrated circuit package 102.

In an example, one or more of the configurable drive circuit 104, the configurable measurement circuit 106, and a control circuit 108 can be co-integrated in a commonly-shared monolithic integrated circuit. The control circuit 108 can include one or more of a state machine, a microcontroller architecture, a general-purpose processor circuit, or can include one or more configurable logic devices, as illustrative examples. A digital interface 114 can be provided, such as providing one or more of a serial or parallel communication interface. Interface circuit 100 configuration information can be provided such as via the digital interface 114 and can be used by the control circuit 108 to select an operational mode of the interface circuit 100, such as by enabling or disabling various functional elements included in one or more of the configurable drive circuit 104 or the configurable measurement circuit 106.

The integrated circuit package 102 can include one or more pins, such as to permit flexibility in applications for the interface circuit 100. For example, the configurable drive circuit 104 can be coupled to an output pin 116A. A first node of a sense resistor 112 can be coupled between the output pin 116A and a second pin 116B, such as where the second pin 116B is coupled to the measurement circuit 106. Alternatively, or in addition, the sense resistor 112 can be located internally to the integrated circuit package 102. The measurement circuit 106 can also be coupled to a third pin 116C, such as coupled to a second node of the sense resistor 112, so that the measurement circuit 106 can monitor a voltage drop across the sense resistor 112. In an illustrative example, the sense resistor 112 can contribute to an overall impedance presented by the interface circuit 100 to the device terminals 120A and 120B. The configurable drive circuit 104 can optionally include a selectable impedance circuit 110, such as to change the input impedance presented by the interface circuit 100. As an illustrative example, the interface circuit 100 can support at least two selectable impedances, including a controlled-impedance mode and a lower-impedance mode. The controlled-impedance mode can provide a specified impedance range, such as to permit digital communication on a channel including conductors coupled to the device terminals 120A and 120B, such as contemporaneously with other stimulus, measurement, or combined stimulus and measurement on the channel.

Figure 2:
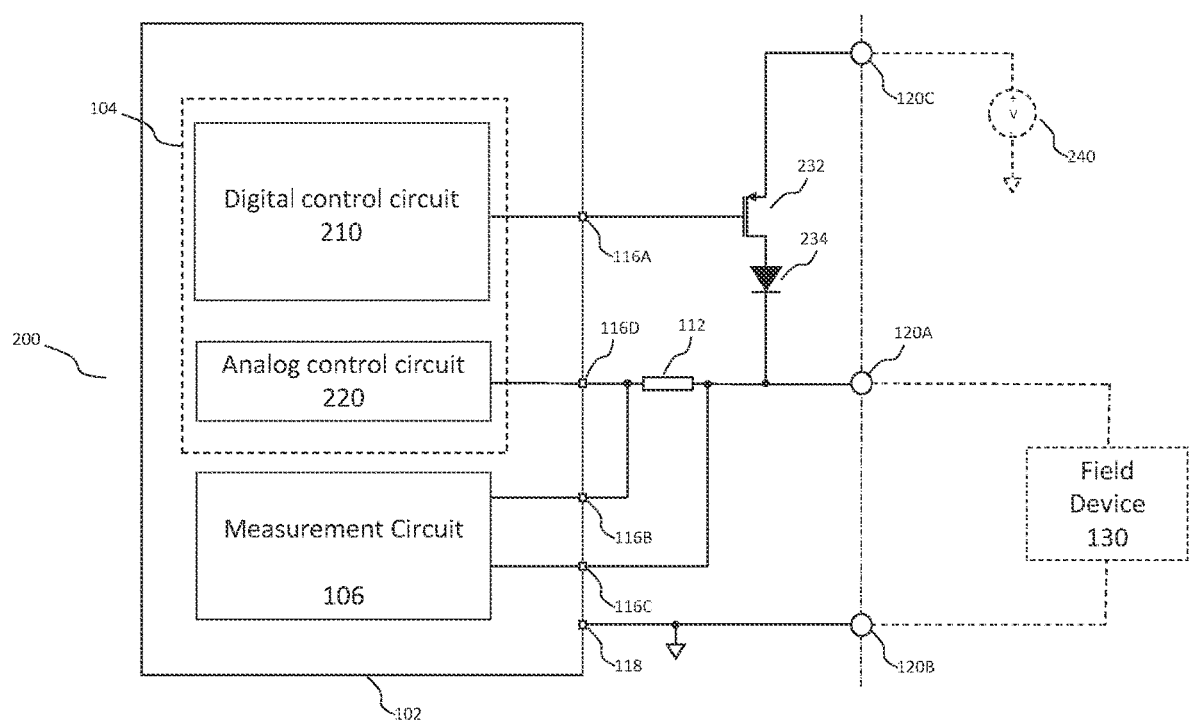
FIG. 2 shows a further example of a configurable interface circuit.

FIG. 2 shows a further example configurable interface circuit 200, which is similar to the circuit 100 of FIG. 1 and like reference numerals denote the same features. It represents the circuitry of a single channel and it will be appreciated that it may optionally include one or more duplicates of the represented circuitry so that the configurable interface circuit 200 includes a plurality of channels. Whilst not represented in FIG. 2, it may also include a control circuit 108 as described with reference to FIG. 1, for selecting and controlling operational modes. The configurable interface circuit 200 supports multiple selectable operational modes, for example by virtue of the drive circuit 104 being software configurable. Some example operational modes are described below. This enables an end user to use the same configurable interface circuit 200 for multiple different functions.

The configurable drive circuit 104 in this example comprises a digital control circuit 210 for controlling a digital signal, and an analog control circuit 220 for controlling an analog signal. The configurable interface circuit 200 further comprises a digital current path formed by a switch 232, which in this example is a p-type FET, and a diode 234. It will be appreciated that a p-type FET is merely one example of a controllable switch and the switch 232 may alternatively comprise any other type of transistor, for example an n-type FET, an n-type or p-type bipolar transistor, an n-type or p-type IGBT, a relay switch, etc. The digital control circuit 210 is configured to control a state of the switch 232 in order to control a digital current that can flow through the digital current path. In the example of FIG. 1, the digital control circuit 210 is configured to control a voltage at the gate of the transistor 232 so as to control whether the transistor 232 is in an on or off state. For example, the digital control circuit 210 may turn on the transistor in order to put the switch 232 in a closed state and allow a current to flow from the external supply 240, through the digital current path and the device terminal 120A, to the field device 130. It may also turn off the transistor in order to put the switch 232 in an open state and stop the flow of current through the digital current path and device terminal 120A. In this way, the supply of a digital current to the field device 130 may be controlled. It will also be appreciated that this may cause a corresponding digital voltage at the device terminal 120A (depending on the nature of the field device 130), and so this operation may be seen as digital current/voltage output. In an alternative, the circuitry may be configured to receive a digital current from the field device (i.e., sink rather than source the digital current), for example by changing the external supply 240, the type of transistor used for the switch 232 and the orientation of the diode 234. In this case, the digital current would flow through the digital current path in the opposite direction and may therefore be seen as a negative current. Regardless, the digital control circuit 210 is controlling a digital current/voltage.

The analog control circuit 220 is coupled to the sense resistor 112. It may be configured to be selectively operable in one or more different analog modes, examples of which are described below. In example, it is configured to control an analog current through the sense resistor 112 such that the analog current flows through the sense resistor 112 and device terminal 120A, to/from the field device 130. Such a mode of operation may be referred to as the analog output current mode, regardless of the direction of current flow, because the current is being controlled by the analog control circuit 220. In another example mode of operation, it may be configured to source or sink an analog current that is controlled by the field device 130, which flows through the device terminal 120A and sense resistor 112. Such a mode of operation may be referred to as the analog input current mode, regardless of the direction of current flow, because the current is controlled by something other than the analog control circuit 220, for example the field device 130. In another example mode of operation, it may be configured to drive an analog output voltage at the output of the analog control circuit 220, which will in turn affect the voltage at the device terminal 120 and may cause an analog current to flow through the analog current path. The driven analog voltage may be positive or negative at the first device terminal 120A and, regardless, this may be referred to as the analog output voltage mode because the voltage is being controlled by the analog control circuit 220. In another example mode of operation, it may be configured to allow another device/entity, such as the field device 130, to drive a voltage at the first device terminal 120A, which may cause an analog current to flow through the analog current path. The driven analog voltage may be positive or negative at the first device terminal 120A and, regardless, this may be referred to as the analog input voltage mode because the voltage is being controlled by something other than the analog control circuit 220.

Therefore, selectable operational modes in which the configurable interface circuit 200 may be configured to operate include a digital mode in which a digital current/voltage is controlled and an analog mode(s) (which may include analog output current mode and/or analog input current mode and/or analog output voltage mode and/or analog input voltage mode). During the digital mode, the configurable drive circuit 104 operates such that the digital control circuit 210 controls the digital current/voltage as described above and the analog control circuit 220 is disabled. During an analog mode, the configurable drive circuit 104 operates in any of the ways described above, and the digital control circuit 210 keeps the switch 232 in an open state.

During an analog mode, optionally the measurement circuit 106 may be configured to simultaneously measure an analog signal (for example, the analog current and/or analog voltage), for example by measuring a voltage across the sense resistor 112. For example, the measurement circuit 106 may comprise an analog to digital converter, ADC, coupled to the pins 116B and 116C, and configured to digitally convert the voltage across the sense resistor 112, which may represent a useful measure of analog voltage in itself (or operationally be useful for deriving some other analog voltage value, for example the voltage at the first device terminal 120A in the event that the analog control circuit 220 knows the voltage at the pin 116B, for example because it is held at a reference voltage such as ground, or because the analog control circuit 220 is drive it to a particular voltage). Additionally or alternatively, the measured voltage across the sense resistor 112 can be used to determine a measure of the analog current flowing through the resistor (from knowledge of the value of the sense resistor 112). The measurement of analog current may optionally be used by the analog control circuit 220 for closed loop feedback control of the analog current if the analog control circuit 220 is operating in the analog output current mode. A measurement of analog voltage across the sense resistor 112, or a measurement of analog voltage at pin 116C in a single ended example, may optionally be used by the analog control circuit 220 during the analog output voltage mode for closed loop feedback control of the voltage so as to provide a compensated voltage to the field device 130, by adjusting the controlled output voltage to compensate for the voltage drop across the sense resistor 112. Further optionally, whilst not shown in FIG. 2 for the sake of simplicity, the analog control circuit 220 may be coupled to pin 116C (and optionally also pin 116B), for example to provide feedback on the analog current and/or the voltage at the first device terminal 120A. In this example, the feedback may be not be a detailed measurement of the magnitude of the current and/or voltage (as would be determined by the measurement circuit 106), but could instead be used to determine if the feedback signal is too high or too low relative to a reference, which would be indicative of whether or not the current and/or voltage being driven by the analog control circuit 220 is too high or too low (for example, as is the case in the detailed example of FIG. 9, described later).

Figure 3:
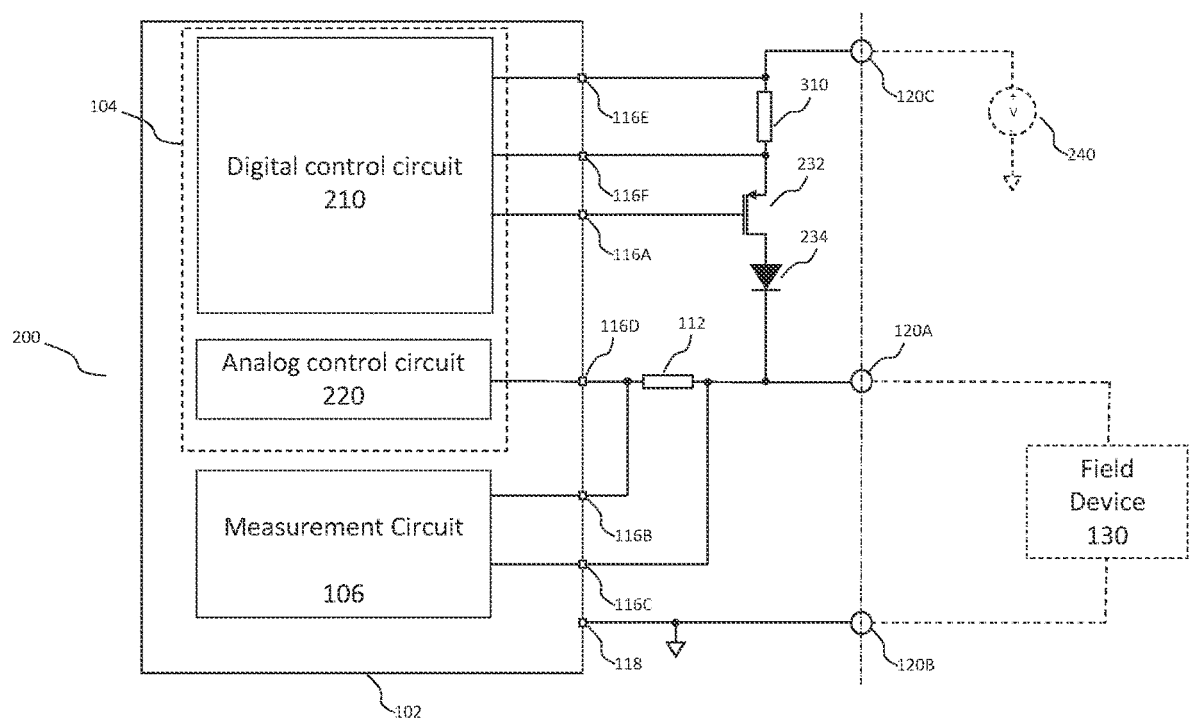
FIG. 3 shows an optional additional feature of the configurable interface circuit of FIG. 2.

FIG. 3 shows an optional additional feature of the configurable interface circuit 200, which a short circuit clamp safety function. For this purpose, the digital current path further comprises a safety resistor 310, the two terminals of which are coupled to the configurable digital control circuit 210 via pins 116E and 116F. The digital control circuit 210 may comprise circuitry to sense the voltage across the safety resistor 310 and, if the sensed voltage exceeds a safety threshold, this may indicate that a short circuit current is flowing through the digital current path. In this case, the digital output circuit 210 may be configured to take action, such as opening the switch 232 to stop current flow and/or turning off the configurable interface circuit 200 altogether to prevent damage.

In the examples of FIGS. 2 and 3, there is no mechanism for measuring the digital current when the configurable interface circuit 200 is operating in a digital mode. In particular, the short circuit clamp safety function does not actually measure the magnitude of digital current, but rather simply senses whether it is above or below the safety threshold. Whilst in some scenarios a measurement of the digital current may not be required (for example where the actual magnitude of the current does not matter), but in other scenarios it may be useful (for example, for diagnostic purposes).

The digital current is typically a lot larger than the analog currents that the configurable interface circuit 200 is configured to handle (the analog current is typically in the order of milliamps, for example between −10 mA to 10 mA, or between −20 mA to 20 mA, or between −50 mA to 50 mA, whereas the digital current is typically in the order of amps, such as up to 1 A, or up to 2 A). This means it may not be practical to route the digital current through the sense resistor 112 and utilise the measurement circuit 106 without either sacrificing measurement accuracy for the analog current, or using a considerably more expensive and power consuming ADC within the measurement circuit 106. In more detail, the measurement circuit 106 would need to be able to measure currents up to the maximum of the digital current, for example up to 1 A or 2 A, which is orders of magnitude larger than the maximum/minimum of the analog current. If the existing ADC that is used to measure analog currents in the range of −10 mA to 10 mA, or −20 mA to 20 mA, is then used to measure digital currents up to 1 A or 2 A, the resolution of measurement will be orders of magnitude worse compared with if it is used only to measure analog currents. Alternatively, to maintain the same resolution of measurement for a range of currents up to 1 A or 2 A would require a considerably more expensive and energy consuming ADC than if the measurement range is only −10 mA to 10 mA, or −20 mA to 20 mA (for example, the sense resistor 112 would need to have a much smaller resistance in order to accommodate the larger digital current with a reasonable voltage drop across the sense resistor 112. The LSB size for the ADC would need to be very small and, as a result the ADC would need to be very low noise in order to measure accurately, which may increase the size and energy consumption of the ADC, which is likely to be impractical). Therefore, it is not practical to route the digital current through the sense resistor 112.

Figure 4:
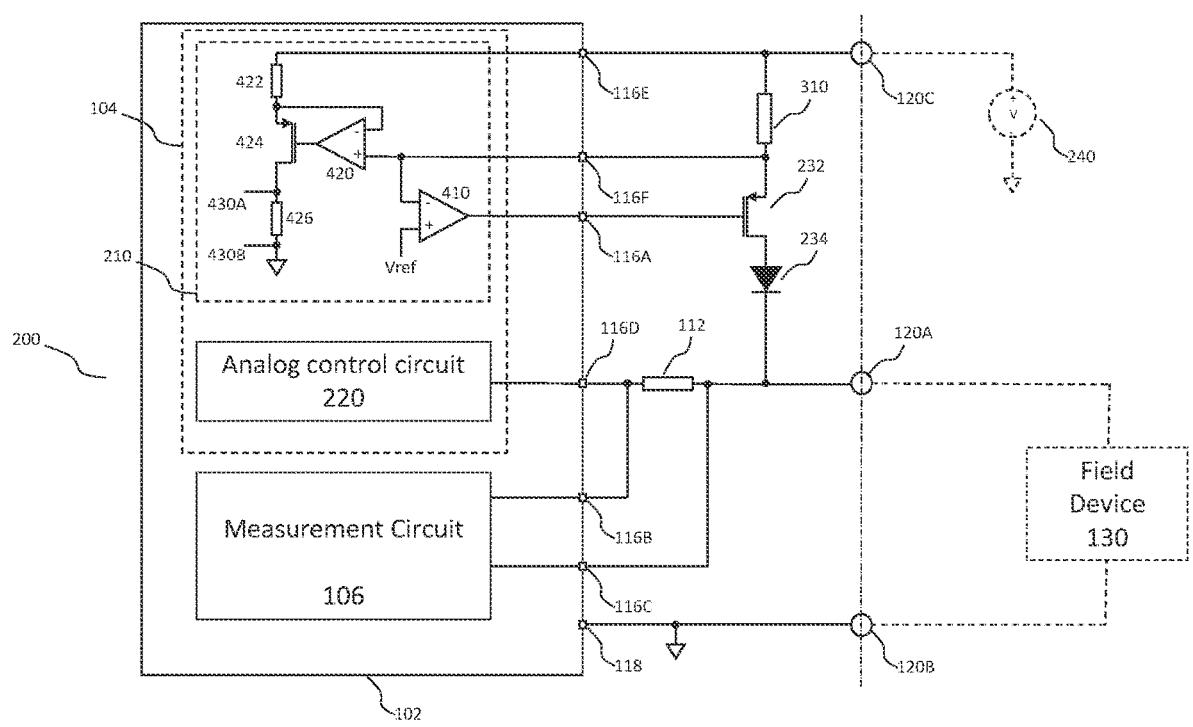
FIG. 4 shows example additional details of an implementation of the configurable interface circuit of FIG. 3.

FIG. 4 shows example additional details of an implementation of the configurable interface circuit 200, arranged to measure the digital current. The digital control circuit 210 comprises an op amp 410 arranged for sensing whether or not the digital current exceeds the safety threshold. In this example, if the digital current is relatively low (and therefore within safe limits), the voltage drop across pins 116E to 116F will be relatively low since there will be only small voltage drop across the safety resistor 310. However, if the digital current is relatively high (and therefore potentially a short circuit current), the voltage drop across pins 116F to 116E will be relatively high as a result of larger voltage drop across the safety resistor 310. If the voltage drop across pins 116E to 116F exceeds Vref (where Vref is a fixed reference threshold voltage with respect to the voltage at pin 116E), then the digital current is considered to have exceeded the safety threshold and the output from the op amp 410 will go high, thereby reducing the Vgs voltage of the FET 232, which limits the digital current during the brief electrical short, or indeed changes the switch 232 to an open state for a prolonged electrical short.

The voltage across the safety resistor 310 is proportional to the digital current/voltage and so measuring a signal that is dependent on this voltage is a way of measuring the digital current/voltage. However, the voltage across the safety resistor 310 is a "high side" voltage, whereas the measurement circuit 106 is a "low side" voltage. Therefore, in order to make use of the measurement circuit 106 to measure the voltage across the safety resistor 310 (which may save silicon area and cost compared with including an additional, "high side" measurement circuit), it is necessary to sense the voltage across the safety resistor 310 and transfer it to the low voltage domain. For this purpose, in the example of FIG. 4, the digital control circuit 210 comprises an op amp 420 arranged to operate as an amplifier, a resistor 422 and FET 424 arranged to translate the voltage across the safety resistor 310 down to the low voltage domain. The translated voltage appears across the resistor 426, such that the nodes 430A and 430B may be coupled to the input of the ADC in the measurement circuit 106 so as to measure the translated voltage. Whilst this technique may be effective for measuring the digital current/voltage, it requires additional circuitry that both increases the cost of the configurable interface circuit 500 and increases the amount of silicon area required by the digital control circuit 210.

Figure 5:
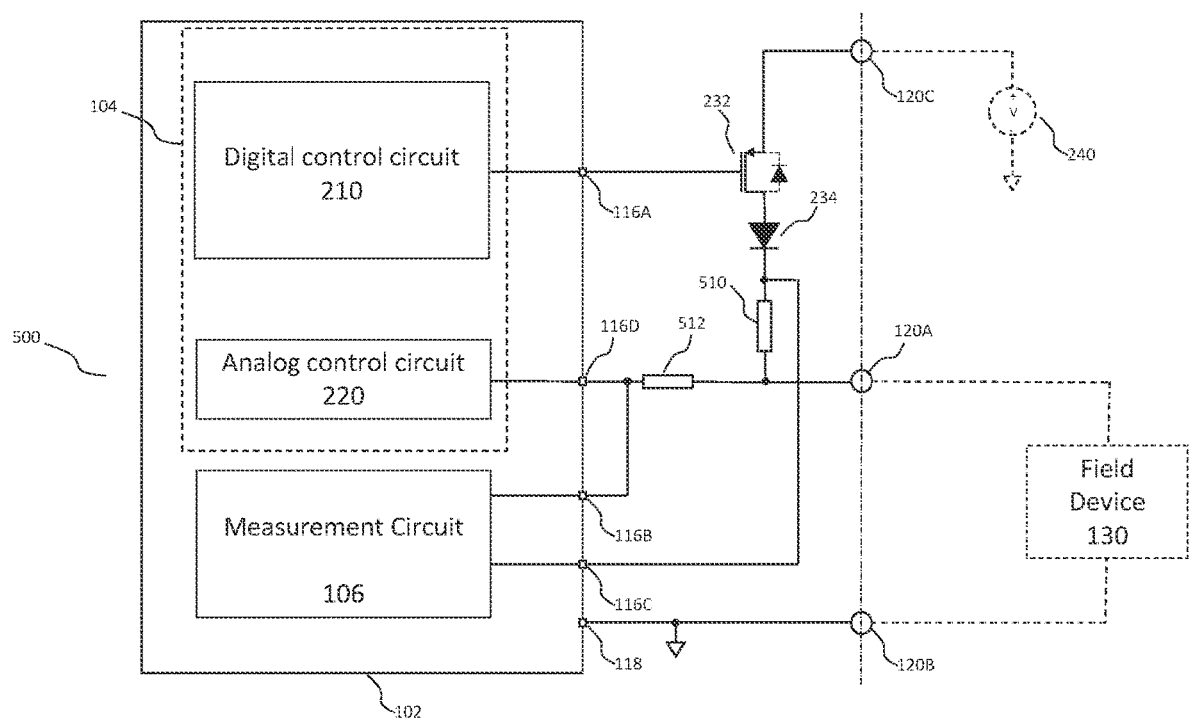
FIG. 5 shows an example of a configurable interface circuit in accordance with an aspect of the present disclosure.

FIG. 5 shows an example configurable interface circuit 500 in accordance with an aspect of the present disclosure. The configurable interface circuit 500 is similar to those described above, but includes additional functionality that enables the measurement of a digital signal (the digital current and/or digital voltage) at minimal additional cost and complexity. The configurable interface circuit 500 supports a plurality of selectable operational modes (for example, software configurable), which includes, but is not limited to, an analog mode and a digital mode. The analog mode may include any one or more of the different selectable analog modes described earlier, for example analog input current mode, analog output current mode, analog input voltage mode, analog output current mode. As such, the analog control circuit 220 may operate in the same way as described earlier.

The configurable interface circuit 500 comprises a first device terminal 120A couplable to the external field device 130. It may also comprise a second device terminal 120B couplable to the external field device 130, although that terminal may be a common terminal shared by many other devices/circuits such that the second device terminal 120B is not actually part of the configurable interface circuit 500. The first device terminal 120A may take any form, for example a plug/socket, screw terminal, or any other form of conductive interface to which the external field device 130 can be electrically coupled.

The configurable interface circuit 500 also comprises a digital current path, which is similar to that of configurable interface circuit 200 (and may optionally also include a safety resistor 310), but further includes a digital sense resistor 510 having a first terminal coupled to the first device terminal 120A. As such, the digital current path in this example comprises the switch 232, the diode 234 and the digital sense resistor 510 coupled in series, such that when operating in the digital output mode, digital current can flow through the devices making up the digital current path. The body diode of the FET that forms the switch 232 is also represented in FIG. 5 and is oriented in the opposite polarity direction to the diode 234. This characteristic is not represented in the subsequent Figures for the sake of simplicity and clarity.

The configurable interface circuit 500 also comprises an analog current path comprising an analog sense resistor 512 having a first terminal coupled to the first device terminal 120A. The analog sensor resistor 512 is essentially the same as the sense resistor 112 described earlier. It should be noted that the digital sense resistor 510 and the analog sense resistor 512 are both simply resistors, and that the terms "digital sense" and "analog sense" are merely used as labelling terms to denote the purpose of each resistor (i.e., to sense the digital signal or to sense the analog signal) and they may alternatively be referred to as a first sense resistor 510 and a second sense resistor 512.

The configurable interface circuit 500 also comprises the measurement circuit 106, which is the same as described earlier, except that it's input terminals are connected to the current paths differentially. The first input terminal of the measurement circuit 106 is coupled (via pin 116C) to a second terminal of the digital sense resistor 510 and the second input terminal of the measurement circuit 106 is coupled (via pin 116B) to a second terminal of the analog sense resistor 512. As a result, the measurement circuit 106 is configured to measure the voltage between, or across, the second terminal of the digital sense resistor 510 and the second terminal of the analog sense resistor 512.

Finally, the configurable interface circuit 500 may comprise a configurable drive circuit 104 comprising a digital control circuit 210 and analog control circuit 220, which operate as described earlier.

Figure 6:
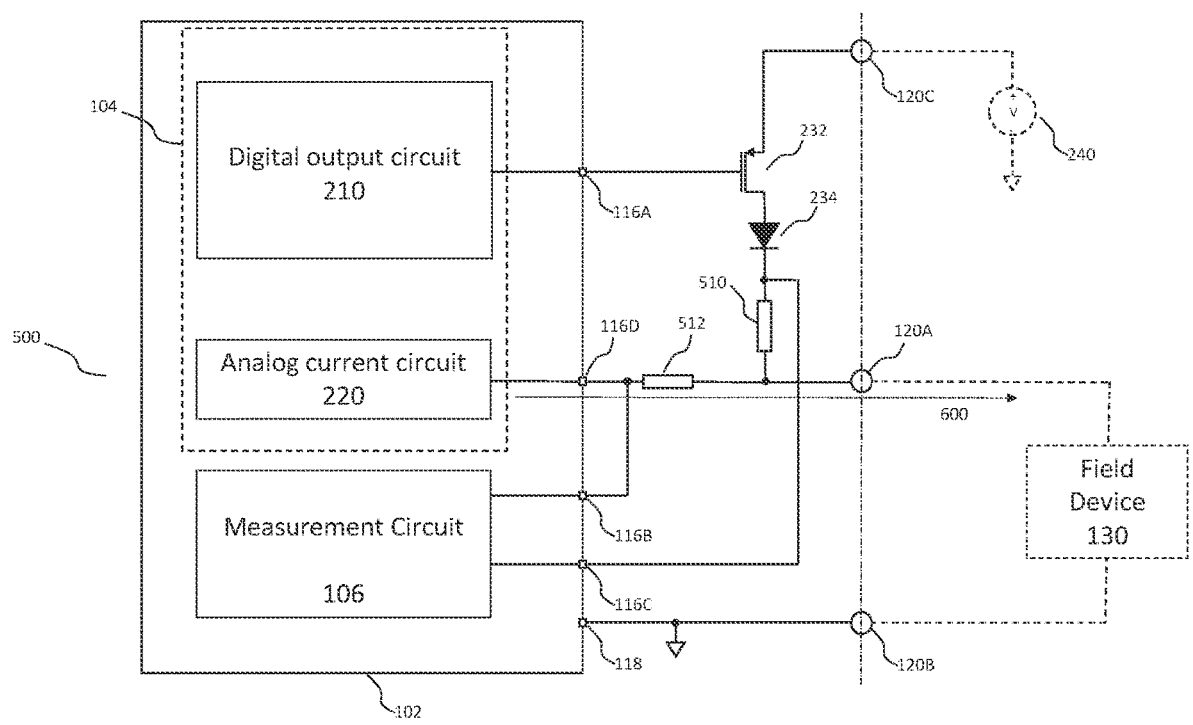
FIG. 6 shows a representation of the configurable interface circuit of FIG. 5 when operating in the analog current mode.

FIG. 6 shows a visualisation of the configurable interface circuit 500 operating in the analog measurement mode, where the analog current is flowing from the analog control circuit 220 to the field device 130 (and may be controlled by the analog control circuit 220—analog current output mode—or by the field device—analog current input mode). The analog current is represented by the arrow 600. As can be seen, the analog current 600 flows through the analog current path and the first device terminal 120A to the field device 130. In an alternative, the analog current 600 may flow in the opposite direction, for example if the analog control circuit 220 is sinking current. During an analog mode of operation, the configurable interface circuit 500 is configured to disable digital output (for example, by virtue of the digital control circuit 210 keeping the switch 232 in an open state) such that no, or negligible, current flows from the power source 240 through the digital current path. Furthermore, no, or negligible, analog current will flow through the digital current path because in this example, the digital current path 234 presents a high impedance to the analog current by virtue of the orientation of the diode 234. Furthermore, the potential of power source 240 at one end of the digital current path may be higher than the potential of the first device terminal 120A, such that the analog current cannot flow through the digital current path. Therefore, depending on the relative potentials at which the configurable interface circuit 500 is designed to operate, the diode 234 may be optional. Furthermore, the measurement circuit 106 is configured to present a high impedance at its first and second inputs. The term "high" is intended to mean an impedance at which no, or negligible, current flows into the measurement circuit 106. The term "negligible" is intended to mean an amount of current that is sufficiently small for the below described measurement functionality to meet accuracy requirements, and is likely to be in the order to micro-amps or less (for example, single digit micro-amps or less, such as less than 10 micro amps, or less than 5 micro amps, etc).

Because no, or negligible, current flows through the digital sense resistor 510, there will be no, or negligible, voltage drop across the digital sense resistor 510. As a result, the potential at the second terminal of the digital sense resistor 510 will be the same (or substantially the same, if negligible current is flowing through the resistor) as the potential at the first terminal of the digital sense resistor 510. Therefore, the voltage between the first input terminal and the second input terminal of the measurement circuit 106 will be the same (or substantially the same) as the voltage across the analog sense resistor 512. Consequently, during this mode of operation, an analog signal can be accurately measured by the measurement circuit 106. In some scenarios, for example during analog input current mode or analog output current mode, the measured analog signal may be the analog current which can be determined from the measured voltage and the value of the analog sense resistor 512 (according to Ohm's law). Additionally or alternatively, during some other scenarios, for example during analog input or output voltage modes, the measured analog signal may be indicative of the analog voltage applied to the first device terminal 120A.

Figure 7:
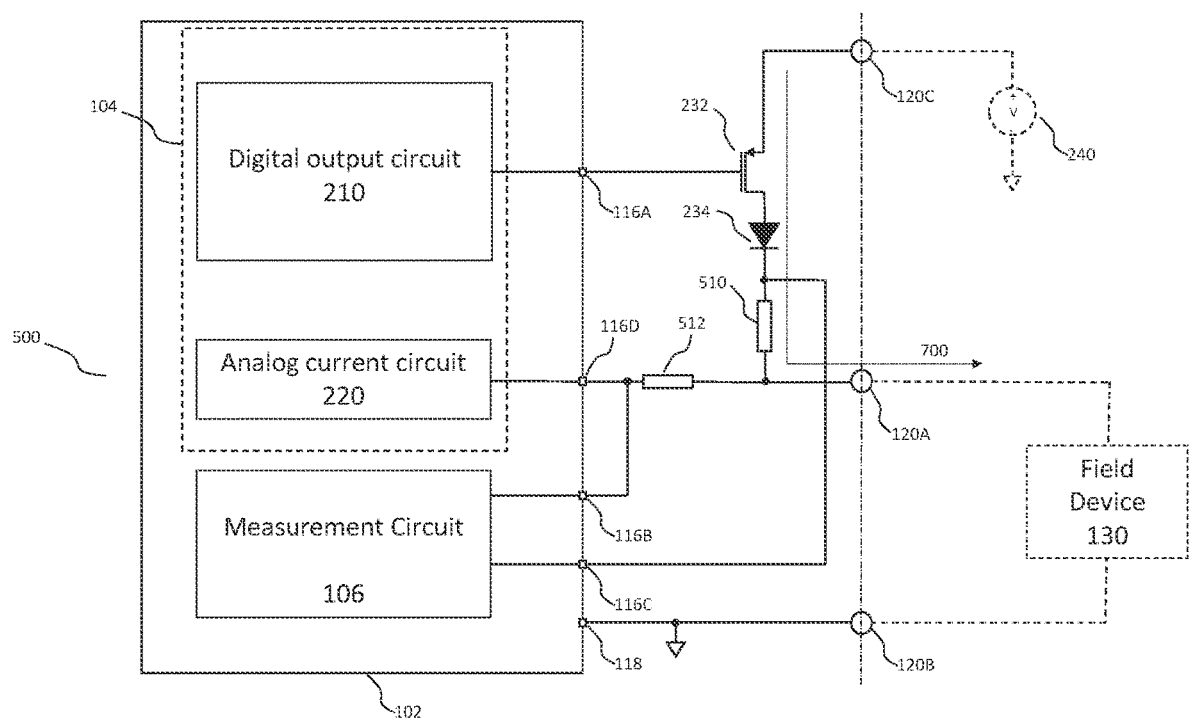
FIG. 7 shows a representation of the configurable interface circuit of FIG. 5 when operating in the digital output mode.

FIG. 7 shows a visualisation of the configurable interface circuit 500 operating in a digital mode where the digital current/voltage is being controlled by the digital control circuit 210. The digital current 700 flows through the digital current path and the first device terminal 120A to the field device 130 (although may alternatively flow in the opposite direction depending on the particular circuit configuration used). During the digital mode of operation, the analog control circuit 220 may be configured to present a high impedance to the analog current path such that no, or negligible, current flows through the analog current path during the digital mode of operation. Additionally or alternatively, the analog current path may comprise one or more components that can present a high impedance to the digital current, such as a diode that is oriented to have its cathode coupled to the second terminal of the analog sense resistor 512. In any event, the analog current path is configured to present a high impedance to the digital current, by virtue of the operation of the analog control circuit 220 and/or one or more components within the analog current path.

Because no, or negligible, current flows through the analog sense resistor 512, there will be no, or negligible, voltage drop across the analog sense resistor 512. As a result, the potential at the second terminal of the analog sense resistor 512 will be the same (or substantially the same, if negligible current is flowing through the resistor) as the potential at the first terminal of the analog sense resistor 512. Therefore, the voltage between the first input terminal and the second input terminal of the measurement circuit 106 will be the same (or substantially the same) as the voltage across the digital sense resistor 510. Consequently, during this mode of operation, the digital current can be accurately measured by the measurement circuit 106, for example by measuring the voltage and using the known resistance of the digital sense resistor 510 (according to Ohm's law). Additionally, or alternatively, the voltage at the first device terminal 120A (eg, the digital voltage) may be determined by measuring the voltage at pin 116B in single ended mode, or by measuring the voltage between the first and second terminals of the measurement circuit 106 and knowing the potential at the third device terminal 120C (i.e., the potential supplied by the power supply 240) and the typical voltage drop of the switch 232 and diode 234.

Therefore, it can be seen that digital signal measurement functionality is added to the configurable interface circuit 500 by virtue of the inclusion of the digital sense resistor 510. The digital sense resistor 510 may be a discrete component, for example mounted on a PCB, or may be an integrated component within an integrated circuit (IC), for example the same IC in which the configurable drive circuit 104 and measurement circuit 106 (and optionally also any one or more of the analog sense resistor 512, switch 232 and diode 234) are integrated. In any event, it will be understood that the cost of an additional resistor is very low (for example, in the order of a few cents), particularly given that digital signal measurement may be for diagnostic purposes only and not require a high precision resistor, and represents very little additional circuit complexity. Furthermore, the existing measurement circuit 106 can be used without any redesign or changes, and no additional pins are required on the IC in which the drive circuit 104 and measurement circuit 106 are implemented, both of which significantly simplify the implementation of this additional feature.

The relative values of the analog sense resistor 512 and digital sense resistor 510 may be set such that when operating in either an analog mode or a digital mode, the voltage between the first input terminal and the second input terminal is within the operating range of the measurement circuit 106. In one example, they may be set so that the possible range of voltages at the input to the measurement circuit 106 is the same in both an analog mode and a digital mode, or so that the possible range of voltages at the input to the measurement circuit 106 in an analog mode and in a digital mode is the same order of magnitude. For example, typically the maximum value of the digital current is greater than the maximum value of the analog current, in which case the resistance of the analog sense resistor 512 may be chosen to be greater than the resistance of the digital sense resistor 510, so that the voltage across the input terminals of the measurement circuit 106 is similar regardless of whether the digital current or analog current is being measured. In one particular, non-limiting example, the configurable interface circuit 500 may be designed to control a digital current that varies between 0 A and 1 A, and designed to handle an analog current between −20 mA and 20 mA (for example, if the configurable interface circuit 500 has modes in which analog current can flow into and output of the circuit). In this case, the resistance ratio of analog sense resistor to digital sense resistor may be set to 100:1, such as 10 ohms for the analog sense resistor 512 and 0.1 ohms for the digital sense resistor 510. This will result in a voltage range at the input to the measurement circuit 106 of 0 to 0.1V when operating in the digital mode, and +/−0.2V when operating in the analog mode. Alternatively, the ratio may be set to 25:1, such as 2.5 ohms for the analog sense resistor 512 and 0.1 ohms for the digital sense resistor 510. This will result in a voltage range at the input to the measurement circuit 106 of 0.1V when operating in either a digital mode or an analog mode.

Figure 8:
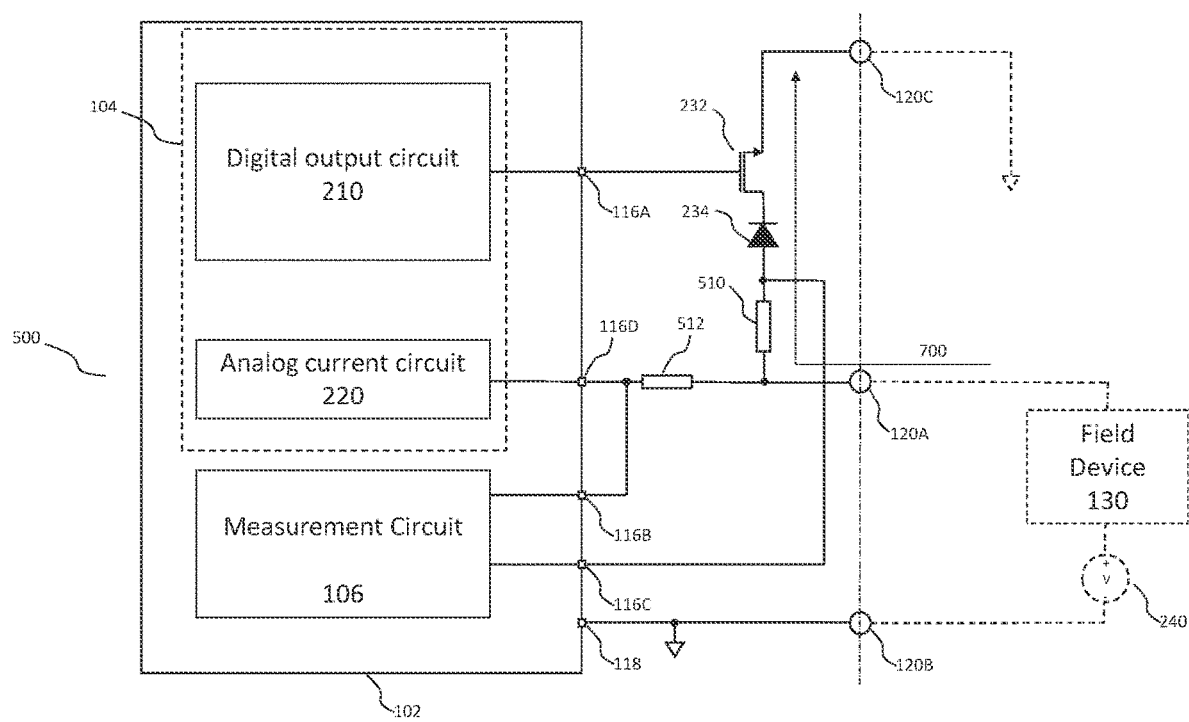
FIG. 8 shows an example of a configurable interface circuit in accordance with a further aspect of the present disclosure, when operating in the digital output mode.

FIG. 8 shows an alternative implementation of the configurable interface circuit 500 in accordance with a further aspect of the present disclosure. It can be seen that in this alternative, the circuit is configured for digital current flow in the opposite direction to that of the earlier example. To this end, the orientation/polarity of the diode 234 is reversed and a different component is used for the switch 232 (specifically an n-type FET). The FET that forms the switch 232 has an inherent body diode that is oriented in the opposite polarity direction to the diode 234 (much like that shown in FIG. 5), although this is not represented in the Figure for the sake of simplicity and clarity. In this example, the digital control circuit 210 controls the digital current 700 as before, by controlling the gate voltage to close the switch 232 to allow current to flow (eg, a digital "1") and open the switch 232 to stop current flow (eg, a digital "0"). When the switch 232 is in an open state, a high impedance is presented on the digital current path so that no, or negligible current can flow. As such, by keeping the switch 232 in an open state during the analog measurement mode, no or negligible current will flow through the digital current path. The diode 234 may optionally be omitted in the voltage at device terminal 120A is at or above that voltage at device terminal 120C (eg, at or above ground).

Figure 9:
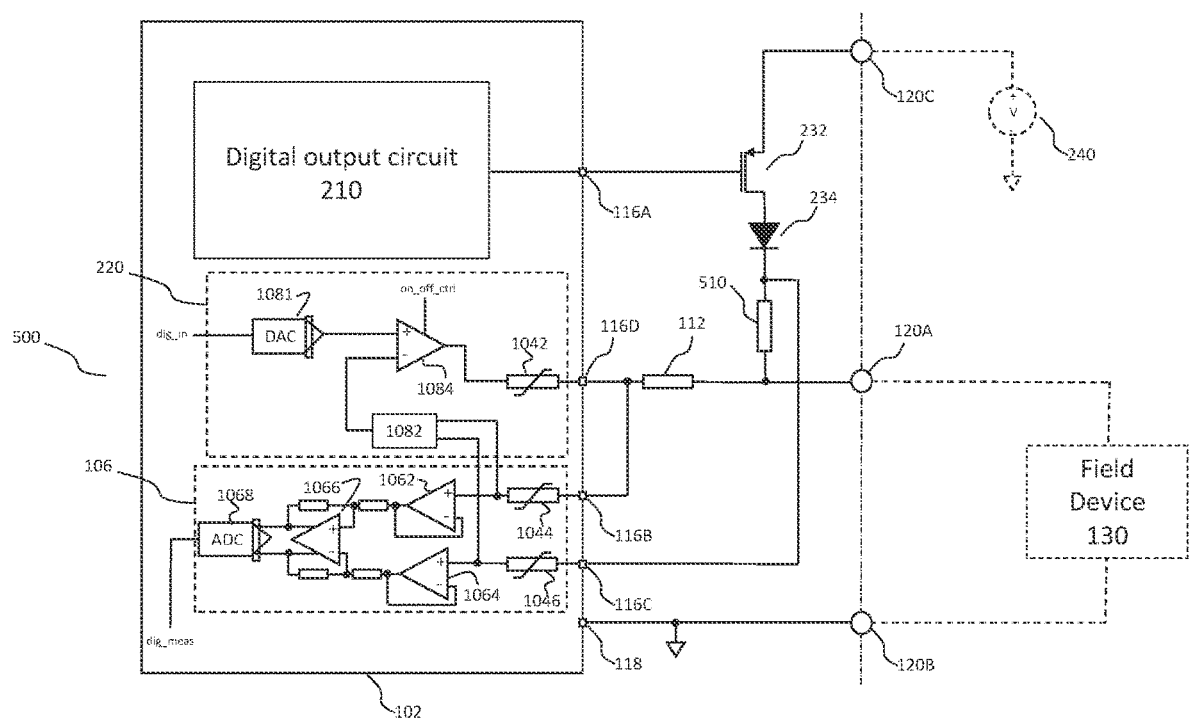
FIG. 9 shows details of an example implementation of the configurable interface circuit of FIG. 5.

FIG. 9 shows a non-limiting example implementation of the analog control circuit 220 and the measurement circuit 106. It will be appreciated that these circuits may be implemented in a variety of different ways to achieve the functionality described above and that this is merely one exemplary implementation. The analog control circuit 220 and the measurement circuit 106 both include optional line protectors 1042, 1044, 1046 coupled to the pins 116B, 116C and 116D in order to help present a high impedance to any current that might otherwise flow into the analog current circuit 220 and the measurement circuit 106 through the pins 116B, 116C and 116D. However, these components may be omitted owing to the high impedance that would otherwise be presented by the inputs to the op amp buffers 1062, 1064 that are optionally included in the measurement circuit 106 and the output to the op amp 1084 that is part of the analog current circuit 220. The measurement circuit 106 in this example comprises a gain stage 1066 (which may be configured to provide a fixed or variable gain) to increase the size of the voltage that is present between the measurement circuits 106 inputs, prior to digital conversion by the ADC 1068. Therefore, the ADC 1068 is configured to digitally convert a signal that is dependent on the voltage across the first and second input terminals of the measurement circuit 106. However, in an alternative, the gain stage 1066 may be omitted and the ADC 1068 convert the voltage signal that is across the first and second input terminals of the measurement circuit 106. The ADC 1068 may be any suitable type of ADC 1068, such as a sigma-delta, pipelined, flash, etc ADC, and is configured to output a digital value, dig_meas, that is a digital conversion of the analog signal at its input.

The analog control circuit 220 in this example is configured for controlling and outputting an analog current and/or driving an output analog voltage. For that purpose it comprises a digital to analog converter, DAC, 1081 configured to receive a digital value, dig_in, and convert it to an analog signal. The digital value, dig_in, may be received from another entity/module, for example from software, and is indicative of the desired analog signal. In this example implementation, the analog control circuit 220 includes a feedback loop formed by an op amp error amplifier 1084 and a feedback circuit 1082 that receives the signals that are present at the first and second inputs of the measurement circuit 106. This may help with maintaining the desired analog signal output from the analog current circuit 220, although the feedback loop circuitry 1082 is optional. The op amp error amplifier 1084 is also configured to receive an on_off_ctrl signal, which may be used to turn off the analog control circuit 220 (for example when the configurable interface circuit 500 is operating in a digital mode), although this may alternatively be achieved by any other means, for example by using a control signal to turn off the DAC 1081.

The analog control circuit 220 may additionally or alternatively by configured to be operable in a mode where it to receives an analog current (for example, supplied by the field device 130), such as during an analog input current and/or voltage mode. As such, configurable bypass circuitry may be included in the analog control circuit 220 and may be enabled during an analog input in order to couple the pin 116D to ground or a current sink. This is not represented in FIG. 9 for the sake of simplicity.

The skilled person will readily appreciate that various alterations or modifications may be made to the above described aspects of the disclosure without departing from the scope of the disclosure.

The terminology "coupled" used above encompasses both a direct electrical connection between two components, and an indirect electrical connection where the two components are electrically connected to each other via one or more intermediate components.

In the analog modes of operation analog voltage input and analog current input, it will be appreciated that the field device 130, for example, may control the voltage or current in any way it desired. For example, it may be configured to control it in a digital way (for example, turning it on and off to create digital "1"s and "0"s), but the configurable interface circuit 500 can still be thought of as having an analog current flowing through the analog current path, since from the perspective of the configurable interface circuit 500, some amount of current can flow through that path and the analog current and/or analog voltage are measurable as described above, regardless of its purpose for which the field device 130 is controlling the received current.

In the above examples, the measurement circuit 106 comprises an ADC for measuring the voltage at pins 116B and 116C. However, in an alternative, the measurement circuit 106 may not comprise an ADC, but may instead include terminals to which an external ADC may be connected in order to measure the voltage that is present at pins 116B and 116C. In this case, it may comprise one or more buffers and output terminals so as to enable the connection of an external ADC in order to measure the voltage across the second terminals of the digital sense resistor 510 and analog sense resistor 512. Therefore, regardless of whether the measurement circuit 106 itself includes an ADC, it is still suitable for use in measuring the voltage between pins 116B and 116C, either using an ADC natively within the measurement circuit 106, or by allowing for the connecting of an external ADC.

Aspects of the Disclosure

Non-limiting aspects of the disclosure are set out in the following numbered clauses:

1. A configurable interface circuit supporting selectable operational modes, including an analog mode and a digital mode, the interface circuit comprising:
   a device terminal couplable to an external field device;
   a digital current path coupled to the device terminal, wherein the digital current path comprises a digital sense resistor having a first terminal coupled to the device terminal; and
   an analog current path comprising an analog sense resistor having a first terminal coupled to the first terminal of the digital sense resistor;
   wherein, when the configurable interface circuit is operating in the analog mode, an analog current can flow through the analog current path and the device terminal and an analog signal is measurable by measuring a voltage between a second terminal of the digital sense resistor and a second terminal of the analog sense resistor, and
   wherein, when the configurable interface circuit is operating in the digital mode, a digital current is controlled to flow through the digital current path and device terminal, and a digital signal is measurable by measuring the voltage between the second terminal of the digital sense resistor and the second terminal of the analog sense resistor.
2. The configurable interface circuit of clause 1, wherein a resistance of the analog sense resistor and a resistance of the digital sense resistor are such that when the configurable interface circuit is operating in either the analog mode or the digital mode, the voltage between the first input terminal and the second input terminal is within an operating range of the measurement circuit.
3. The configurable interface circuit of any preceding clause, wherein a maximum value of the digital current is greater than a maximum value of the analog current, and
   wherein the resistance of the analog sense resistor is greater than the resistance of the digital sense resistor.
4. The configurable interface circuit of any preceding clause, wherein the digital sense resistor is a discrete component.
5. The configurable interface circuit of any preceding clause, wherein the digital current path further comprises a switch, and wherein the configurable interface circuit further comprises:
   a digital control circuit coupled to the switch and configured, when the configurable interface circuit is operating in the digital mode, to control the digital current by controlling a state of the switch.
6. The configurable interface circuit of clause 5, wherein when the configurable interface circuit is operating in the analog mode, the digital drive circuit is configured to keep the switch in an open state.
7. The configurable interface circuit of clause 5 or clause 6, wherein the switch comprises a transistor.
8. The configurable interface circuit of any preceding clause, wherein the configurable interface circuit is configured to present a high impedance at the digital current path to the analog current when the configurable interface circuit is operating in the analog mode.
9. The configurable interface circuit of clause 8, wherein the digital current path further comprises a diode arranged such that, when the configurable interface circuit is operating in the digital mode, the digital current can flow through the digital current path, and when the configurable interface circuit is operating in the analog mode, the analog current is blocked from flowing through the digital current path by the diode.
10. The configurable interface circuit of any preceding clause, wherein the configurable interface circuit is configured to present a high impedance at the analog current path to the digital current when the configurable interface circuit is operating in the digital mode.
11. The configurable interface circuit of any preceding clause, further comprising a measurement circuit for use in measuring the voltage between the second terminal of the digital sense resistor and the second terminal of the analog sense resistor, the measurement circuit comprising:
   a first input terminal coupled to a second terminal of the digital sense resistor; and
   a second input terminal coupled to a second terminal of the analog sense resistor.
12. The configurable interface circuit of clause 11, wherein the measurement circuit comprises an analog to digital converter, ADC, configured to digitally convert a signal that is dependent on the voltage between the first input terminal and the second input terminal.
13. The configurable interface circuit of any preceding clause, wherein the digital current path is couplable to an external supply for supplying or sinking the digital current.
14. The configurable interface circuit of any preceding clause, wherein the analog current is supplied by the external field device.
15. The configurable interface circuit of any of clauses 1 to 13, further comprising:

an analog control circuit coupled to the analog current path, wherein the analog current is controlled by the analog control circuit.

16. The configurable interface circuit of any preceding clause, wherein the measurement circuit is implemented within an integrated circuit.

17. The configurable interface circuit of any preceding clause, wherein the measured analog signal comprises the analog current.

18. The configurable interface circuit of any preceding clause, wherein the measured analog signal comprises an input voltage at the device terminal.

19. The configurable interface circuit of any preceding clause, wherein the digital signal comprises the digital current.

20. The configurable interface circuit of any preceding clause, wherein the digital signal comprises a digital voltage at the device terminal.

21. A method for operating a configurable interface circuit in any of a plurality of selectable operational modes, including an analog mode and a digital mode, wherein the configurable interface circuit comprises:
a device terminal couplable to an external field device;
a digital current path coupled to the device terminal, wherein the digital current path comprises a digital sense resistor having a first terminal coupled to the device terminal;
an analog current path comprising an analog sense resistor having a first terminal coupled to the first terminal of the digital sense resistor; and
a measurement circuit comprising:
a first input terminal coupled to a second terminal of the digital sense resistor; and
a second input terminal coupled to a second terminal of the analog sense resistor,
wherein the method comprises:
when the configurable interface circuit is operating in the analog mode and an analog current can flow through the analog current path:
measuring, by the measurement circuit, an analog signal by measuring a voltage between the first input terminal and the second input terminal, and
when the configurable interface circuit is operating in the digital mode and a digital current can flow through the digital current path:
measuring, by the measurement circuit, a digital signal by measuring the voltage between the first input terminal and the second input terminal.

22. An interface circuit supporting a plurality of selectable operational modes, the interface circuit comprising:
a device terminal couplable to an external field device;
a first current path coupled to the device terminal, wherein the first current path comprises a first sense resistor having a first terminal coupled to the device terminal; and
a second current path comprising a second sense resistor having a first terminal coupled to the first terminal of the first sense resistor;
wherein, when the interface circuit is operating in a first mode where a first current can flow through the first current path, the interface circuit is configured to measure a first signal by measuring a voltage between a second terminal of the first sense resistor and a second terminal of the second sense resistor, and
wherein, when the interface circuit is operating in a second mode where a second current can flow through the second current path, the interface circuit is configured to measure a second signal by measuring the voltage between the second terminal of the first sense resistor and the second terminal of the second sense resistor.

23. The interface circuit of clause 22, wherein a maximum possible value of the first current is greater than a maximum possible value of the second current.

24. The interface circuit of clause 22 or clause 23, wherein a resistance of the first sense resistor is smaller than a resistance of the second sense resistor.

25. The interface circuit of any of clauses 22 to 24, wherein the first mode is a digital mode and the second mode is an analog mode.

26. The interface circuit of any of clauses 22 to 25, wherein the first signal is the first current, and wherein the second signal is the second current.

The invention claimed is:

1. A configurable interface circuit supporting selectable operational modes, including an analog mode and a digital mode, the interface circuit comprising:
a device terminal couplable to an external field device;
a digital current path coupled to the device terminal, wherein the digital current path comprises a digital sense resistor having a first terminal coupled to the device terminal; and
an analog current path comprising an analog sense resistor having a first terminal coupled to the first terminal of the digital sense resistor;
wherein, when the configurable interface circuit is operating in the analog mode, an analog current can flow through the analog current path and the device terminal and an analog signal is measurable by measuring a voltage between a second terminal of the digital sense resistor and a second terminal of the analog sense resistor, and
wherein, when the configurable interface circuit is operating in the digital mode, a digital current is controlled to flow through the digital current path and device terminal, and a digital signal is measurable by measuring the voltage between the second terminal of the digital sense resistor and the second terminal of the analog sense resistor;
wherein the interface circuit further comprises a measurement circuit for use in measuring the voltage between the second terminal of the digital sense resistor and the second terminal of the analog sense resistor, the measurement circuit comprising:
a first input terminal coupled to a second terminal of the digital sense resistor; and
a second input terminal coupled to a second terminal of the analog sense resistor.

2. The configurable interface circuit of claim 1, wherein a resistance of the analog sense resistor and a resistance of the digital sense resistor are such that when the configurable interface circuit is operating in either the analog mode or the digital mode, the voltage between the first input terminal and the second input terminal is within an operating range of the measurement circuit.

3. The configurable interface circuit of claim 2, wherein a maximum value of the digital current is greater than a maximum value of the analog current, and
wherein the resistance of the analog sense resistor is greater than the resistance of the digital sense resistor.

4. The configurable interface circuit of claim 1, wherein the digital sense resistor is a discrete component.

5. The configurable interface circuit of claim 1, wherein the digital current path further comprises a switch, and wherein the configurable interface circuit further comprises:

a digital control circuit coupled to the switch and configured, when the configurable interface circuit is operating in the digital mode, to control the digital current by controlling a state of the switch.

6. The configurable interface circuit of claim 5, wherein when the configurable interface circuit is operating in the analog mode, the digital drive circuit is configured to keep the switch in an open state.

7. The configurable interface circuit of claim 1, wherein the configurable interface circuit is configured to present a high impedance at the digital current path to the analog current when the configurable interface circuit is operating in the analog mode.

8. The configurable interface circuit of claim 7, wherein the digital current path further comprises a diode arranged such that, when the configurable interface circuit is operating in the digital mode, the digital current can flow through the digital current path, and when the configurable interface circuit is operating in the analog mode, the analog current is blocked from flowing through the digital current path by the diode.

9. The configurable interface circuit of claim 1, wherein the configurable interface circuit is configured to present a high impedance at the analog current path to the digital current when the configurable interface circuit is operating in the digital mode.

10. The configurable interface circuit of claim 1, wherein the measured analog signal comprises the analog current.

11. The configurable interface circuit of claim 1, wherein the measured analog signal comprises an input voltage at the device terminal.

12. The configurable interface circuit of claim 1, wherein the measured digital signal comprises the digital current.

13. The configurable interface circuit of claim 1, wherein the measured digital signal comprises a digital voltage at the device terminal.

14. A method for operating a configurable interface circuit in any of a plurality of selectable operational modes, including an analog mode and a digital mode, wherein the configurable interface circuit comprises:
- a device terminal couplable to an external field device;
- a digital current path coupled to the device terminal, wherein the digital current path comprises a digital sense resistor having a first terminal coupled to the device terminal;
- an analog current path comprising an analog sense resistor having a first terminal coupled to the first terminal of the digital sense resistor; and
- a measurement circuit for use in measuring the voltage between the second terminal of the digital sense resistor and the second terminal of the analog sense resistor, the measurement circuit comprising:
  - a first input terminal coupled to a second terminal of the digital sense resistor; and
  - a second input terminal coupled to a second terminal of the analog sense resistor;

wherein the method comprises:
when the configurable interface circuit is operating in the analog mode and an analog current can flow through the analog current path:
measuring an analog signal by measuring a voltage between a second terminal of the digital sense resistor and a second terminal of the analog sense resistor, and
when the configurable interface circuit is operating in the digital mode and a digital current can flow through the digital current path:
measuring a digital signal by measuring the voltage between the second terminal of the digital sense resistor and the second terminal of the analog sense resistor.

15. An interface circuit supporting a plurality of selectable operational modes, the
interface circuit comprising:
- a device terminal couplable to an external field device;
- a first current path coupled to the device terminal, wherein the first current path comprises a first sense resistor having a first terminal coupled to the device terminal;
- a second current path comprising a second sense resistor having a first terminal coupled to the first terminal of the first sense resistor; and
- a measurement circuit for use in measuring the voltage between the second terminal of the digital sense resistor and the second terminal of the analog sense resistor, the measurement circuit comprising:
  - a first input terminal coupled to a second terminal of the digital sense resistor; and
  - a second input terminal coupled to a second terminal of the analog sense resistor;

wherein, when the interface circuit is operating in a first mode where a first current can flow through the first current path, the interface circuit is for use in measuring a first signal by measuring a voltage between a second terminal of the first sense resistor and a second terminal of the second sense resistor, and wherein, when the interface circuit is operating in a second mode where a second current can flow through the second current path, the interface circuit is for use in measuring a second signal by measuring the voltage between the second terminal of the first sense resistor and the second terminal of the second sense resistor.

16. The interface circuit of claim 15, wherein a maximum possible value of the first current is greater than a maximum possible value of the second current.

17. The interface circuit of claim 15, wherein a resistance of the first sense resistor is smaller than a resistance of the second sense resistor.

18. The interface circuit of claim 15, wherein the first mode is a digital mode and the second mode is an analog mode.

19. The interface circuit of claim 15, wherein the first signal is the first current, and wherein the second signal is the second current.

* * * * *